(12) United States Patent
Boettcher et al.

(10) Patent No.: US 8,250,321 B2
(45) Date of Patent: Aug. 21, 2012

(54) METHOD FOR OPERATING A MEMORY DEVICE

(75) Inventors: Joern Boettcher, Abstatt (DE); Jens Liebehenschel, Liederbach (DE)

(73) Assignee: Robert Bosch GmbH, Stuttgart (DE)

( * ) Notice: Subject to any disclaimer, the term of this patent is extended or adjusted under 35 U.S.C. 154(b) by 541 days.

(21) Appl. No.: 12/294,400

(22) PCT Filed: Mar. 14, 2007

(86) PCT No.: PCT/EP2007/052382
§ 371 (c)(1),
(2), (4) Date: Apr. 15, 2009

(87) PCT Pub. No.: WO2007/110327
PCT Pub. Date: Oct. 4, 2007

(65) Prior Publication Data
US 2009/0319732 A1      Dec. 24, 2009

(30) Foreign Application Priority Data

Mar. 24, 2006  (DE) .......................... 10 2006 013 763

(51) Int. Cl.
*G06F 13/00*           (2006.01)
(52) U.S. Cl. ....................................................... 711/156
(58) Field of Classification Search .................. 711/156; 365/201, 185
See application file for complete search history.

(56) References Cited

U.S. PATENT DOCUMENTS

| 5,475,693 | A | 12/1995 | Christopherson |
| 5,761,440 | A * | 6/1998 | De Marco et al. ............ 709/245 |
| 5,890,188 | A | 3/1999 | Okamoto et al. |
| 6,275,960 | B1 | 8/2001 | Cappelletti et al. |
| 6,339,546 | B1 | 1/2002 | Katayama et al. |
| 6,671,837 | B1 * | 12/2003 | Reohr et al. .................. 714/719 |
| 2004/0202024 | A1 | 10/2004 | Shinagawa |

FOREIGN PATENT DOCUMENTS

| JP | 2003-076604 | 3/2003 |
| JP | 2004-362001 | 12/2004 |

OTHER PUBLICATIONS

International Search Report, PCT/EP2007/052382, dated Jul. 6, 2007.

* cited by examiner

*Primary Examiner* — Hoai V Ho
*Assistant Examiner* — Pablo Huerta
(74) *Attorney, Agent, or Firm* — Kenyon & Kenyon LLP

(57) ABSTRACT

In a method for operating a memory device that includes a number of blocks, a bit pattern is allocated to a memory region, i.e. at least one memory cell, of a block after performance of a delete operation that is separate from a write operation, so that for the case of a flip of at least one bit within the memory region, a change of state for that block can be detected.

6 Claims, 1 Drawing Sheet

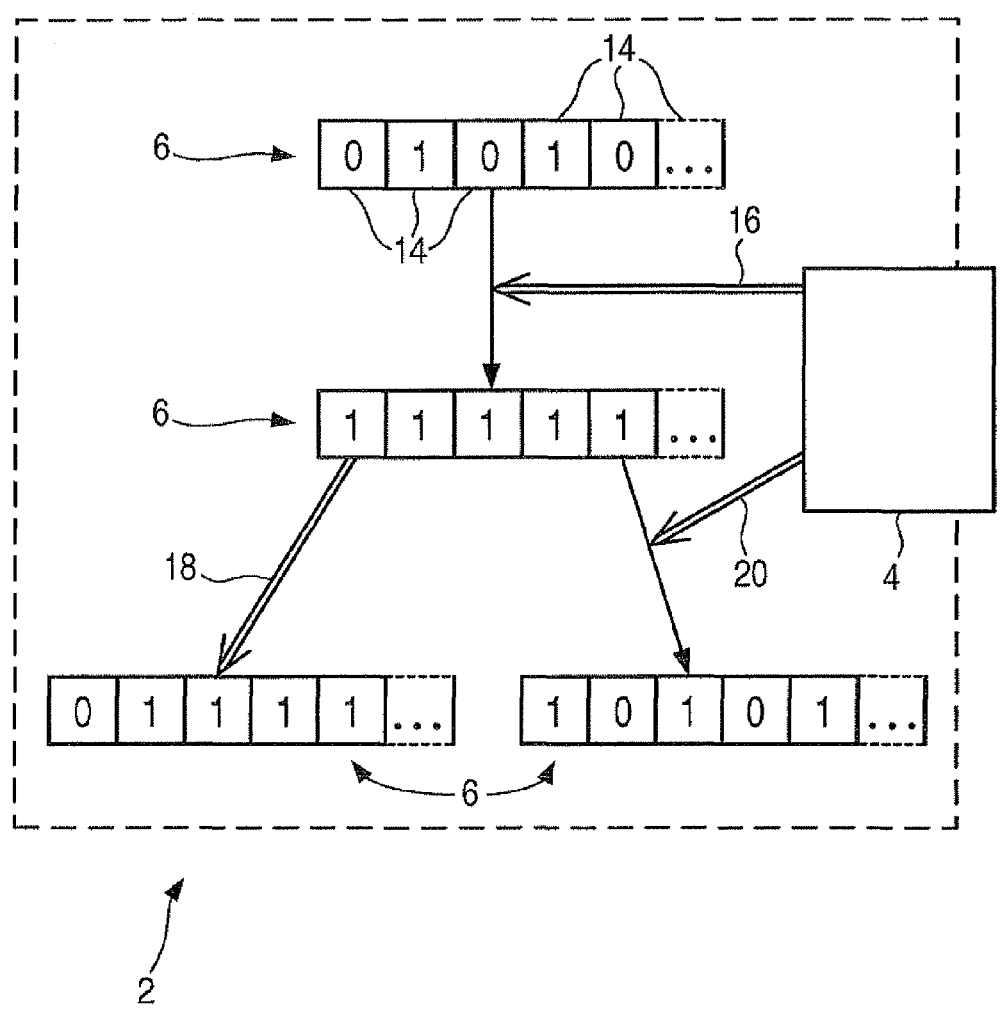

METHOD FOR OPERATING A MEMORY DEVICE

FIELD OF THE INVENTION

The present invention relates to a method for operating a memory device, to an apparatus for operating a memory device, to a memory device, to a computer program, and to a computer program product.

BACKGROUND INFORMATION

Memory devices or memory media have a limited service life that is determined substantially by the number of write operations. As the number of write operations increases, the data retention time becomes shorter. One goal in the development of memory devices is therefore to use memory devices economically in terms of the relevant operations and thus to decrease stress on memory hardware, for example by: reducing the write operations. If necessary, other resources such as RAM, ROM, or runtime can be used within reasonable limits for this purpose. The intention is thereby to achieve an extension of the service life of memory devices.

SUMMARY

In block-oriented memory devices or file systems for which the method is applicable, a memory region is usually divided into, for example, logical blocks of identical size. Blocks can assume different states such as, for example, free or occupied. Blocks contain at least one administrative datum, which need not necessarily be stored together with the data. The data can be stored in concatenated lists of blocks. Each concatenated list is made up of at least one block. As a rule, no fixed allocation of data and memory regions on the medium is provided, so that the data are constantly being stored in different blocks at different positions. The result is that the memory device is stressed more uniformly than is the case with a fixed allocation of data to blocks or to memory regions. Before data are written, it is necessary to search for free or empty blocks. Defective blocks should not be selected in the context of the search for free blocks. Overall, however, the largest possible number of blocks should always be available.

Upon execution of the method according to example embodiments of the present invention for operating a memory device that includes a number of blocks, a memory region (i.e. at least one memory cell) of a block has a first bit pattern allocated to it after performance of a delete operation that is separate from a write operation. In the case of a flip of at least one bit within this memory region, a change of state for that block can be detected.

The apparatus according to example embodiments of the present invention for operating a memory device that includes a number of blocks is embodied to allocate a bit pattern to a memory region (i.e. to at least one cell) of a block after performance of a delete operation that is separate from a write operation, so that for the case of a flip of at least one bit within the memory region, a change of state for that block can be detected.

Example embodiments of the present invention further relate to a memory device that includes a number of blocks and is embodied to allocate a bit pattern to a memory region (i.e. to at least one cell) of a block after performance of a delete operation that is separate from a write operation, so that for the case of a flip of at least one bit within the memory region, a change of state for that block can be detected.

All the steps of the method can be carried out with the apparatus and the memory device. An interaction can exist between the apparatus and the memory device. In example embodiments, the apparatus can be embodied as a component of the memory device, or the memory device as a component of the apparatus.

The computer program having a program code arrangement is embodied to carry out all the steps of a method when the computer program is executed on a computer or on a corresponding calculation unit, in particular on an apparatus.

Example embodiments of the present invention further relate to a computer program product having a program code arrangement that are on a computer-readable data medium, in order to carry out all the steps of a method when the computer program is executed on a computer or on a corresponding calculation unit, in particular on an apparatus.

When the method is carried out, a block is classified and correspondingly marked as deleted by introduction of a new state, by allocating the first of two possible bit values or bits to the at least one memory cell of the block. The delete operation for a previous content of the block is performed separately from a write operation for a new content of that block, so that the delete and write operations are carried out, in particular, separately and independently from one another in time and not, as is otherwise usual, automatically or directly successively. Blocks generally comprise multiple memory cells; at least one block can be used in particular for storage of an, in particular, nonvolatile datum; said datum can be stored and deleted by modifying the content of memory cells of the at least one block.

The method may be used in particular for a memory device in which the probability that the first bit value will turn into the second bit value by flipping is greater than the probability that the second bit value will turn into the first bit value by flipping.

This kind of separate execution of the delete operation, the write operation, and an assignment of the new "deleted" state means in particular that so-called memory-related changes of state of the block, which as a rule are caused by physical influences, can be better detected, by the fact that the first bit value is allocated to the at least one memory cell of the block. A marking of the block as deleted, or an assignment of the "deleted" state in connection with the delete operation, can be accomplished after, in particular immediately after, the delete operation and thus continuously therewith. In the context of implementation of the invention, this can also mean that assignment of the "deleted" state can be accomplished implicitly with the delete operation, and thus as part of the delete operation.

Example embodiments of the present invention make it possible, in particular in the context of block-oriented memory devices of file systems, for example in EEPROMs, to extend the service life of such memory devices and thus improve availability of a service for managing and/or storing, for example, nonvolatile data. The method presented decreases the probability of employing physically defective blocks for the storage of data. It is furthermore possible to prevent physically intact blocks from not being used for storage.

In certain conventional procedures, a block of a memory device is automatically deleted when new data are written into the block, the write operation and the delete operation being executed together or in a manner coupled to one another.

With example embodiments of the present invention, however, provision is made, for block-oriented memory devices that are embodied, for example, as EEPROMs, that, with support from the hardware and software, the or a delete operation is performed separately from the or a writing operation. The two operations are thus independent from one another in time. A subsequent or later writing action results in the same stress on the corresponding memory region as a write operation that, as with conventional procedures, encompasses a delete operation.

In the case of the separate delete and write operations, the fact that the block can assume the further "deleted" state, with no influence on the number of write operations or accesses, is exploited. Assignment of this state, or corresponding marking of the block, can thus be accomplished upon performance of the delete operation. The deleted block can be correspondingly marked. A specific situation can thereby be coded. The "deleted" state is marked, and thus identified, by way of a specific bit pattern of the at least one memory cell of a memory region, or all the memory cells of a block. The use of the additional "deleted" state allows an extension of the service life of the memory device, or of a corresponding medium, to be achieved. This is not possible, however, when the delete and write operations are executed together.

Marking with the new "deleted" state, and a separation of the delete and write operations in the context of the memory device, are used to increase the probability of correctly detecting a status of blocks. The boundary conditions, and a code of the administrative information and of the data of the respective blocks, are suitably adapted for this purpose when the method is carried out.

In an example embodiment, the present method can be supplemented with a procedure for detecting defective blocks, According to this example embodiment of the method, a block can be marked as intact; in this case the block is either free or occupied. If an, in particular, memory-related change of state occurs for the block, this being an inadvertent or unintentional change of state that is not caused by a user intervention, the block can furthermore be marked as defective or suspect. This change of state can be caused by at least one error, and can automatically become perceptible as a result of the flipping of at least one bit of the at least one memory device. Depending on a nature or a frequency of the error, the block is categorized and correspondingly classified as either suspect or defective. An explicit marking as suspect or defective can be performed.

Blocks detected or marked as suspect can be observed with regard to further development. An at least originally intact block can be marked as suspect after occurrence of a first error. According to this procedure, a block can be marked as defective only after two successive errors, such that the second error must occur in the "suspect" state. Utilizing these states, it is possible additionally to increase the probabilities of correctly detecting the states of the blocks.

In an example embodiment described hereinafter, implementation of the method is based on the assumption that the method is used for a block-oriented file system or a block-oriented memory device having a number of blocks. Each block is made up of data or useful data, and an administrative datum that supplies information as to a status and type of the block, and provides a pointer to the next block. Test data can also be inserted. By determining such test data it is possible to check, for a block in which at least one bit is flipped, whether the block's content is in the state that was written. Changes of state that are presumed to be memory-related, as well as changes of state deliberately brought about by an intentional operation, can thus be detected via the test data. Let it now be assumed that in the example embodiment described here, the status of the block is coded by way of the code, or a bit pattern, of the memory cells. In the context of the method presented in the embodiment, provision is made (with no limitation as to generality) that the memory cells can assume the binary values one ("1") and zero ("0"). In other embodiments of the invention, any suitable characters that represent unique, preferably binary, values can be allocated to the memory cells.

A data set is made up of a first block, and can contain multiple further blocks; this depends on the length of a datum.

Table 1 below presents examples of blocks in different states and their respective codes. In this exemplifying embodiment, each code encompasses eight memory cells, the code being provided in order to define and/or mark the state of the respective block.

In the examples depicted in Table 1, for the free and therefore deleted blocks, all the values for the memory cells of the code are ones. For the first block of the data set, the first memory cell of the code is a one; the further memory cells are occupied by arbitrary bit values, with the exception of the bit pattern for free blocks. For a suspect block, the first memory cell of the code has a zero and the further memory cells are ones. A first memory cell of a code of a further block of the datum is a zero; the further memory cells are arbitrary, with the exception of the bit pattern for suspect blocks.

TABLE 1

| Code status | Administrative information, data, checksum(s) | Comment |
|---|---|---|
| 00000000-01111110 | arbitrary values | Further block of a datum |
| 01111111 | 1111111 | Suspect block |
| 10000000-11111110 | arbitrary values | First block of a datum |
| 11111111 | 1111111 | Free block |

When blocks are deleted upon execution of the delete operation, which means that their contents and therefore data are deleted, provision is made that the value one or "1", i.e. logical 1, is assigned or allocated to, in particular, the first memory cell of the code of a respective block. This type of allocation or marking can be carried out automatically or implicitly with the delete operation, or at least immediately after the delete operation. As a result of this feature, the status of the block can be marked by way of the code, and thus quickly and reliably detected in the context of a check.

Assigning the value or bit value "1" to this first memory cell in order to determine the status of the block is useful when it is more probable that a bit value within the code will flip from "1" into the state of zero or "0", i.e. logical 0, than vice versa.

The code for the status can furthermore code as to whether the block in question is a first or a further block within the data set. Also located therein is a code for the ID under which the datum can be found in the memory device.

Occupied blocks hence contain the value "logical 0" at least one memory cell other than the first memory cell. In a further example embodiment of the present invention, these occupied blocks can be recognized as correct or faulty by determining the test data. Defective blocks look like suspect blocks, but in the code for defective blocks the value or bit value "0" is present at least one further memory cell. When a block is to be marked as a free block, it is deleted. It is thus possible to make use of the additional "deleted" state of the memory device by separating the delete and write operations. Marking a deleted (and therefore free) block does not require a write access. A write access is performed only when the deleted block has data written to it again.

Because it is more probable that the bit value will flip from "1" to "0" than vice versa, in a further example embodiment of the present invention a bit pattern "1 . . . 1" made up of ones is selected for the code of the free or deleted block. In an embodiment, the method can also encompass the possibility that by making available the bit pattern according to which the first bit value is allocated to the at least one memory cell and the block is thus marked as deleted, the delete operation occurs automatically, so that a marking of the block as deleted can also correspond to the delete operation or can encompass it. The result is on the one hand that possible memory errors can be detected, and on the other hand stress on the memory device or on a medium is reduced, since a write access is not necessary in order to detect the state.

Errors can be detected with high probability in the case of a suspect block as well. The code of a suspect block differs by only one memory cell from the code of a free block. This bit at the (preferably first) code memory cell marking the state also serves to differentiate a first block of a data set and the further blocks for that data set.

If the error occurs at the code memory cell marking the status of the free block, that block can become a suspect block. If the error at this memory cell marking the status occurs in the context of a suspect block, that block can be used without difficulty for any block of a data record, with the exception of the first block. The differentiation of the codes for the first and for all further blocks is selected so that a first block in a list can become a further block with a much greater probability than a further block can become a first block.

In a further example embodiment of the method, codes in Table 1 can be used for other states. For example, the status made up only of "0" is well suited, in certain memories, for marking defective blocks.

In memory devices or file systems of this type, in addition to the functions (such as reading, writing, and deleting) visible to a user, a further function is provided for purging the memory device. This function encompasses, for example, releasing incomplete chains and marking suspect blocks. In the context of all the operations mentioned, it may be necessary to detect or mark the status of blocks. A specific procedure for implementation can depend on nonfunctional demands on the system.

The method can be defined in detail based on a weighting of the nonfunctional demands. It is possible in particular to define the times at which and the operations with which particular types of blocks become marked, and which types of blocks may be used to store data. Marking for the at least one memory cell of a particular code, the status of the block being indicated by way of this at least one memory cell, is selected, depending on the application, in such a way that with high probability, and in particular in consideration of bit flips and aborted delete and write operations, blocks that are defective on the basis of the (in particular, memory related) change of state are detected as defective, and intact blocks as intact.

In general, the cause of a defective memory content cannot be detected with one-hundred-percent certainty. Errors may involve, for example, physical faults in the memory hardware or uncompleted write operations that are caused by voltage interruptions or resets. Nevertheless, when a memory error is detected, often either the corresponding block is marked as defective and not used again, or the error is ignored and the block is reused. In an example embodiment of the present method, blocks can be marked as deleted and thus as free, and furthermore as intact, as suspect, and as defective. It is possible in this fashion to increase the availability of data that are stored or to be stored.

The method can encompass a strategy for reviving or reactivating suspect blocks. There are various aspects of this strategy, for example reviving as necessary, after a certain time, and/or in accordance with certain stipulations, according to which, for example, only a required number of blocks, or all suspect non-defective blocks, are revived. A specific configuration of this strategy once again depends on the non-functional demands on the memory device. One example for a weighting of non-functional demands can encompass making a decision as to whether the data security or the service life of the memory device is more important. One possible question in this regard would be whether a data loss (with the consequence that a written datum cannot be read) or a memory loss (with the consequence that a memory cell is incorrectly detected as defective) is more acceptable.

Depending on the hardware and software used, inverse preconditions may exist: the deleted state of the memory cell corresponds to "0", and the probability of bit flips from "0" to "1" is greater than from "1" to "0". This requires simply a different, in particular inverse, code or design of the bit pattern of the at least one memory cell. The other markings for detecting the further states described above need to be modified accordingly. The method per se remains unchanged as a result.

The code can vary, for example, in terms of a configuration and/or the constituents of the administrative information and data. This can relate to a status (i.e. a type and status of the block), to a reference to a next block of a datum, and/or to a use and types of checksums and their arrangement. The code can furthermore vary as a function of a type of block-oriented memory device. Provision can be made, for example, to store the administrative information separately from the data. In a memory apparatus embodied alternatively thereto, on the other hand, the administrative information can be stored together with the data.

Example embodiments of the present invention can be used in embedded systems, for example control units in motor vehicles, that respectively contain memory devices according to example embodiments of the present invention and/or interact therewith.

By exploiting the use of the additional "deleted" state that is made available by the separate execution of the delete and write operations, a reduction in the number of write operations, and an extension of the service life of the memory device, can be achieved. Use of the above-described method can increase availability in the context of certain block-oriented EEPROM file systems in which blocks are marked as intact, suspect, or defective.

Further advantages and example embodiments of the present invention are evident from the description and the appended drawings.

It is understood that the features recited above and those yet to be explained below can be used not only in the respective combination indicated, but also in other combinations or in isolation, without leaving the context of the present invention.

Example embodiments of the present invention are depicted schematically in the drawings and will be described in detail below with reference to the drawings.

BRIEF DESCRIPTION OF THE DRAWINGS

FIG. 1 schematically depicts an exemplifying embodiment of an apparatus and of a memory device having a block, in the context of an example embodiment of the method.

DETAILED DESCRIPTION

Memory device 2 (dashed box) and apparatus 4 depicted schematically in FIG. 1 interact in the context of execution of the example embodiment of the method that is described. Memory device 2 has an arbitrary number of blocks 6 that are provided for the storage of data In FIG. 1, a block 6 is depicted in various states. The respective states are marked by bit values that are allocated to memory cells 14 of block 6.

In the first state, block 6 has a datum written to it. This is marked by the fact that the first memory cell of code 14 has the bit value "0", i.e. logical 0, assigned to it; in this exemplifying embodiment, the bit values "1010" are assigned to the four further memory cells 14 in order to characterize the datum.

Upon execution of the method, a content of the present block 6 is deleted by apparatus 4, and a delete operation 16 is thus performed. Immediately after this delete operation 16, the bit value "1", i.e. logical 1, is assigned to first memory cell 14 and to each of the four further memory cells 14 of block 6. This allocation marks block 6 as deleted, so that this deleted block 6 can quickly be identified in the context of a search for free blocks for storage of new data.

For the case in which a change of state 18 for block 6, which change in this example embodiment involves a memory-related change of state 18, happens to occur, this change of state becomes perceptible by flipping of the bit value from (in the present exemplifying embodiment) "1" to "0" in first memory cell 14 of the block. In this exemplifying embodiment it is the case for memory device 2 that a probability of a memory-related flip of a bit value from "1" to "0" is greater than from "0" to "1". A random or unintentional flip of this kind is usually caused by an error in the corresponding memory cell 14. Based on the selection made for a code of memory cells 14 or for a bit pattern of memory cells 14 of the block, the (for example, error-related) flip of the bit value becomes automatically evident, with the result that change of state 18 of block 6 can easily be detected.

A write operation 20 in which a new datum is stored in block 6 can be performed by apparatus 4 at a later point in time, independently of delete operation 16, for the deleted block 6. Here the value "0" is assigned to first memory cell 14 of block 6. Bit values "0101", which characterize this new datum, are assigned to the further memory cells 14.

What is claimed is:

1. A method for operating a memory device including a number of blocks, comprising:
   allocating a specific bit pattern to all memory cells of a block after performance of a delete operation that is separate from a write operation, wherein the specific bit pattern indicates a deleted status of the block, so that for the case of an unintended flip of a bit value of at least one cell within the block, a change of state for the block is detectable; and
   marking the block as suspect after detecting the unintended flipping of the bit value of the at least one cell of the block, wherein the marking of the block as suspect includes altering a bit value of at least one arbitrary cell of the block.

2. The method according to claim 1, wherein the block is identified as a deleted block on the basis of the bit pattern in the context of a search for free blocks for storage of new data.

3. The method according to claim 1, wherein a "1 . . . 1" bit pattern is assigned to the block when the block is deleted, and for marking the block as suspect, a bit pattern is used that has only bit values of "1" except for at least one "0" at arbitrary locations.

4. The method according to claim 1, wherein a "0 . . . 0" bit pattern is assigned to the block when the block is deleted, and for marking the block as suspect, a bit pattern is used that has only bit values of "0" except for at least one "1" at arbitrary locations.

5. An apparatus for operating a memory device having a number of blocks, comprising:
   means for allocating a specific bit pattern to all memory cells of a block after performance of a delete operation that is separate from a write operation, wherein the specific bit pattern indicates a deleted status of the block, so that for the case of an unintended flip of a bit value of at least one cell within the block, a change of state for the block is detectable; and
   means for marking the block as suspect after detecting the unintended flipping of the bit value of the at least one cell of the block, wherein the marking of the block as suspect includes altering a bit value of at least one arbitrary cell of the block.

6. A memory device, comprising:
   a number of blocks, wherein each block is configured to allocate a specific bit pattern to all memory cells of a block after performance of a delete operation that is separate from a write operation, wherein the specific bit pattern indicates a deleted status of the block, so that for the case of an unintended flip of a bit value of at least one cell within the block, a change of state for the block is detectable, and wherein the block is marked as suspect after detecting the unintended flipping of the bit value of the at least one cell of the block, wherein the marking of the block as suspect includes altering a bit value of at least one arbitrary cell of the block.

* * * * *